(12) United States Patent
Mori

(10) Patent No.: US 6,842,224 B2
(45) Date of Patent: Jan. 11, 2005

(54) EXPOSURE METHOD AND APPARATUS

(75) Inventor: Kenichiro Mori, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/633,093

(22) Filed: Jul. 30, 2003

(65) Prior Publication Data

US 2004/0021841 A1 Feb. 5, 2004

(30) Foreign Application Priority Data

Aug. 1, 2002 (JP) ........................................ 2002-225127

(51) Int. Cl.⁷ ............................................. G03B 27/42
(52) U.S. Cl. ........................... 355/53; 355/67; 355/71; 250/548; 430/311
(58) Field of Search ............................. 355/53, 67, 71, 355/77, 68; 250/205, 548; 430/311

(56) References Cited

U.S. PATENT DOCUMENTS

| 5,345,292 A | 9/1994 | Shiozawa et al. |
| 5,357,311 A * | 10/1994 | Shiraishi ...................... 355/53 |
| 5,726,740 A | 3/1998 | Shiozawa et al. |
| 6,211,944 B1 | 4/2001 | Shiraishi |
| 6,355,382 B1 * | 3/2002 | Yasuzato et al. ............... 430/5 |
| 2002/0177048 A1 | 11/2002 | Saitoh et al. |

FOREIGN PATENT DOCUMENTS

| JP | 4-225514 | 8/1992 |
| JP | 5-21312 | 1/1993 |
| JP | 5-283317 | 5/1993 |

* cited by examiner

Primary Examiner—D. Rutledge
(74) Attorney, Agent, or Firm—Morgan & Finnegan, L.L.P.

(57) ABSTRACT

An exposure method illuminates a mask that forms a desired pattern and an auxiliary pattern smaller than the desired pattern, and projects light from the mask onto an object to be exposed via a projection optical system at a position offset from a focus position that provides the highest resolution so that the auxiliary pattern is not resolved.

10 Claims, 21 Drawing Sheets

PROJECTION
OPTICAL SYSTEM
PUPIL DIAMETER

PROJECTION
OPTICAL SYSTEM
PUPIL DIAMETER

EXPOSURE METHOD AND APPARATUS

This application claims the right of priority under 35 U.S.C. §119 based on Japanese Patent Application No. 2002-225127, filed on Aug. 1, 2002, which is hereby incorporated by reference herein in its entirety as if fully set forth herein.

BACKGROUND OF THE INVENTION

The present invention relates generally to exposure methods, and more particularly to an exposure method used to manufacture devices such as single crystal plates for semiconductor wafers and glass plates for liquid crystal displays ("LCD"). The present invention is suitable, for example, for a projection exposure method for an object with a contact-hole line pattern or a mixture of isolated contact hole and contact-hole line in a photolithography process.

Recent demands on smaller and thinner profile electronic devices have increasingly demanded finer semiconductor devices to be mounted onto these electronic devices. For example, a design rule has attempted to form a circuit pattern of 100 nm or less on a mass production line, and which will expectedly shift to 80 nm or less. The mainstream photolithography technology has conventionally used a projection exposure apparatus that projects and transfers a pattern on a mask (a reticle) onto a wafer.

The following equation provides the resolution R of the projection exposure apparatus using a light-source wavelength $\lambda$ and a numerical aperture ("NA") of the projection optical system:

$$R = k_1 \times \frac{\lambda}{NA} \quad (1)$$

A focus range that may maintain certain imaging performance is called a depth of focus ("DOF"), which is defined in the following equation:

$$DOF = k_2 \times \frac{\lambda}{NA^2} \quad (2)$$

While Equations 1 and 2 indicate that a shorter wavelength and a larger NA are effective to finer processing, it is unfeasible since the DOF disadvantageously decreases in inverse proportion to the NA. In addition, the shorter wavelength would disadvantageously reduce transmittance of a glass material, and a larger NA makes difficult a design and manufacture of a lens.

Accordingly, the resolution enhanced technology ("RET") has been recently proposed which reduces the process constant $k_1$ for fine processing. One RET is modified illumination, which is also referred to as oblique incidence illumination, multi-pole illumination, or off-axis illumination. The modified illumination arranges an aperture stop with a light-shielding plate on an optical axis in an optical system near an exit surface of a light integrator for forming a uniform surface light source, and introduces exposure light oblique to a mask, as disclosed, for example, in Japanese Laid-Open Patent Application No. 5-21312. The modified illumination may reduce the value of the process constant $k_1$ down to 0.3 smaller than 0.5 in the usual illumination, and contribute to fine processing.

The instant assignee has already proposed another RET, in Japanese Patent Application No. 2002-123268, which illuminates a mask that forms a desired pattern to be transferred and an auxiliary pattern using strong illumination light with high resolving power to resolve the desired pattern, and illumination light with low resolving power to restraining the auxiliary pattern from resolving.

For example, while a mask having only a desired pattern 31 shown in FIG. 13 is usually used to resolve a contact-hole pattern 21 shown in FIG. 12, the instant assignee has proposed that the resolving power improves when a mask pattern is used which arranges not only the desired pattern 31 to form the contact-hole pattern 21 but also an auxiliary pattern 32 smaller than the desired pattern. An exposure method for resolving only the desired pattern 31 by illuminating a mask that includes a desired pattern and a dummy pattern under certain conditions is referred to as "Exposure Method I". Here, FIG. 12 is a schematic plane view of the contact-hole pattern 21. FIG. 13 is a schematic plane view of a mask pattern that arranges a desired pattern to expose the same.

The mask arranges, like a mask 30 shown in FIG. 14, a desired contact-hole pattern 31 at a predetermined pitch and an auxiliary or dummy pattern 32 around the desired pattern 31. Here, FIG. 14 is a schematic view of the binary mask 30 that forms the desired contact-hole pattern 31 and auxiliary pattern 32. It is preferable that the mask 30 shown in FIG. 1 sets t/d to be 0.7 or greater where "t" is an opening diameter of the desired pattern 31 to resolve the contact-hole pattern 21 and "d" is an opening diameter of the unresolved auxiliary pattern 32 to assist the desired pattern 31 in resolving.

As discussed in detail below, only the desired contact-hole pattern may be exposed with good resolving power onto an object, such as a wafer, by illuminating this mask 30 using plural types of light, such as cross oblique incidence illumination (referred to as enhancement illumination part) to resolve the desired contact-hole pattern, and illumination (referred to as restraint illumination part) to restrain the cross oblique incidence illumination from resolving the auxiliary pattern (in other words, to limit the exposure dose for the auxiliary pattern (a little increased exposure dose) and to enhance the exposure dose for the desired contact-hole pattern (much increased exposure dose)).

When the mask 30 shown in FIG. 14 that has a small pitch in the contact holes is illuminated with small σ illumination, diffracted beams deviate from the pupil surface in the projection optical system in the exposure apparatus except for the $0^{th}$ order diffracted beam. More specifically, there occur the $0^{th}$ order diffracted beam 10 and diffracted beams 11–18 of other orders as shown in FIG. 15A, and diffracted beams except for the $0^{th}$ order diffracted beam deviate from the pupil surface, whereby no pattern is formed under this condition. Here, FIG. 15A is a typical view showing a relationship between diffracted beams and the pupil surface in the projection optical system for small σ illumination to the mask 30 shown in FIG. 14.

Therefore, illumination is required to allow the diffracted beams 11–18 to enter the pupil. For example, in order to allow illustrative two diffracted beams 10 and 15 to enter the pupil in the projection optical system shown in FIG. 15A, the illumination light may be moved to form oblique incidence illumination as shown in FIG. 15B. The oblique incidence illumination may enable the $0^{th}$ order diffracted beam and one of $\pm 1^{st}$ order diffracted beams 15 to enter both ends in the pupil in the projection optical system, and interference between these two diffracted beams incident upon the pupil forms linear interference bands at a regular pitch on the object.

FIG. 16 shows a relationship between the $0^{th}$ order diffracted beam and the $1^{st}$ order diffracted beams in oblique incidence illumination for a mask pattern with fine pitches. Area "a" of the $0^{th}$ order diffracted beam, $\pm 1^{st}$ order diffracted beams occur like "b" and "c". In FIG. 16, a shape of the area "a" allows one of $\pm 1^{st}$ order diffracted beams to enter the pupil. Left and right circles of the pupil in the projection optical system have the same diameter as the pupil diameter in the projection optical system, and their centers are offset from the center of the pupil by a predetermined amount (or an interval between 10 and 15 in FIG. 15). In other words, the oblique incidence illumination that arranges the $0^{th}$ order diffracted beam in the area "a" enables one of $\pm 1^{st}$ order diffracted beams 15 to enter the pupil, and interference between these two diffracted beams forms linear interference bands at a regular pitch on the object.

Similarly, the oblique incidence illumination that arranges the $0^{th}$ order diffracted beam in the area "b" enables one of $\pm 1^{st}$ order diffracted beams 15 to enter the pupil in the area "a".

As shown in FIG. 17, four streamlined effective light-source areas as a combination area of two circles would form linear infringe bands on an object to be exposed at a regular pitch in longitudinal and lateral directions, and strong and weak parts appear at two-dimensional pitches at intersection points overlapping light intensity distributions. In other words, the above enhancement illumination part corresponds to four (beveled) streamlined areas having a longitudinal direction in a direction perpendicular to a radial direction of crossed pupil as shown in FIG. 17. The other part (i.e., part other than beveled part in the pupil in the projection optical system) corresponds to the above restraint illumination part.

The desired contact-hole pattern 31 on the mask 30 is larger than the auxiliary pattern 32 and thus has stronger light intensity than the peripheral, forming the desired contact-hole pattern. However, as shown in FIGS. 18A and 18B, the mere cross oblique incidence illumination would result in the resolution of the auxiliary pattern and creates an unnecessary pattern other than the desired contact-hole pattern. Here, FIG. 18 is a view of simulated resolved pattern on the object corresponding to the right effective light-source shape.

As shown in FIG. 19, the exposure dose of a thin solid ray resolves not only the desired pattern P1 but also auxiliary pattern P2 when sliced at the exposure-dose threshold or resist threshold shown by a thin dotted line in FIG. 19 where the desired contact-hole pattern P1 has a desired diameter value. Here, FIG. 19 shows a relationship between the exposure dose and an image on the object corresponding to the exposure dose for the crossed oblique incidence illumination and inventive modified illumination.

Accordingly, the instant assignee has proposed to add the effective light-source distribution, i.e., the above restraint illumination part that allows only one diffracted beam to enter the pupil surface, to the effective light-source distribution shown in FIG. 17. Preferably, the diffracted beam is $0^{th}$ order diffracted light as the only one diffracted beam. FIG. 20 shows an exemplary effective light-source distribution.

The exposure dose shows like a thick solid ray as shown in FIG. 19 when the mask 30 is illuminated using an effective light-source distribution shown in FIG. 21 that has a cross-shaped blank at its center and is close to an addition between the effective light-source distribution shown in FIG. 17 that allows two diffracted beams to enter the pupil and the effective light-source distribution shown in FIG. 20 that enables one diffracted beam to enter the pupil. The exposure dose particularly increases at part corresponding to the desired contact-hole pattern on the mask 30, and provides the desired pattern P3 in which the dummy resolution pattern P2 disappears at the exposure-dose threshold or resist threshold shown by a thick dotted line in FIG. 19 where the desired contact-hole pattern has a desired diameter value.

In summary, Exposure Method I is characterized in using an effective light-source shape 40 shown in FIG. 22 that has two functions with light-transmitting part 41 and light-shielding part 42. In other words, the effective light-source shape 40 may be divided into two, as shown in FIGS. 23A and 23B. Four parts 51 in FIG. 23A serves to effectively resolve the desired pattern, but may possibly resolves the auxiliary pattern 32 around the desired pattern 31. On the other hand, four parts 52 in FIG. 23B clarifies an outline of the desired pattern 31 and serves to restrain the auxiliary pattern 32 from resolving. Therefore, only the desired pattern 31 resolves and the auxiliary pattern 32 does not when the mask 30 shown in FIG. 14 is exposed with an effective light-source shape shown in FIG. 22. Here, FIG. 23 is a plane view that dissolves the effective light-source shape 40 into two, FIG. 23A is a schematic plane view of the part 51 that contribute to resolution of the desired pattern 31, and FIG. 23B is a schematic plane view of the part 52 that restrains the auxiliary pattern 32 from resolving.

The modified illumination needs to create an effective light-source shape corresponding to the modified illumination. One method to form the effective light source for the modified illumination is to insert a stop corresponding to an effective light source formed at a pupil in the projection optical system. However, the stop shields the light and this method has low light use efficiency and lowers throughput as the number of exposed objects per unit time.

Various methods have been proposed to improve light use efficiency in the modified illumination. For example, Japanese Laid-Open Patent Application No. 5-283317 proposes a method to introduce the light using a prism. Use of the method proposed in Japanese Laid-Open Patent Application No. 5-283317 would form an annular effective light source using a cone prism, and a quadrupole effective light source using a pyramid prism.

However, the above RET proposed by the instant assignee needs a sum of an effective light-source distribution as strong modified illumination for improved resolving power and an effective light source distribution to restrain the resolution of the auxiliary pattern from resolving, and this distribution is hard to form in the illumination optical system using a prism.

A method has been proposed, for example, by Japanese Laid-Open Patent Application 4-225514, which forms an effective light source for the modified illumination using a diffractive optical element. While use of computer generated hologram ("CGH") as a diffraction optical element would form an arbitrary effective light-source shape and the above complex effective light source, the diffraction efficiency of the diffraction optical element is as low as about 80% and improved light use efficiency cannot be expected.

BRIEF SUMMARY OF THE INVENTION

Accordingly, it is an exemplified object of the present invention to provide an exposure method and apparatus which may improve the resolving power for a desired pattern to be transferred without lowering the light use efficiency and throughput.

An exposure method of one aspect according to the present invention includes the steps of illuminating a mask that forms a desired pattern and an auxiliary pattern smaller than the desired pattern, and projecting light from the mask onto an object to be exposed via a projection optical system at a position offset from a focus position that provides the highest resolution so that the auxiliary pattern is not resolved.

An exposure method of another aspect of the present invention includes the step of illuminating a mask that forms a desired pattern and an auxiliary pattern smaller than the desired pattern, and projecting the light from the mask onto an object to be exposed via a projection optical system at positions which are different in defocus amount.

The desired pattern may be a contact-hole pattern. The mask two-dimensionally may arrange the contact-hole pattern and the auxiliary pattern like a matrix. The step may form a quadrupole effective light-source shape that includes two pairs of light transmitting parts, two lines each connecting each pair of light transmitting parts constituting a coordinate for the contact-hole pattern. A distance "A" between the best focus position and the defocus position may meet $0<A \leq k_1 \times (D/S) \times (\lambda/NA^2)$ where D is a hole diameter of the contact-hole pattern, S is a hole diameter of the auxiliary pattern, P is a half-pitch of the contact-hole pattern and auxiliary pattern, $\lambda$ is a wavelength of exposure light, NA is a numerical aperture of the projection optical system, and $k_1=(NA/\lambda) \times P$.

The step may use illumination light that includes a first component incident perpendicularly upon the mask a second component that is incident obliquely upon the mask and has light amount smaller than that of the first component. The step may expose the object at the best focus position as well as the defocus position. The step may incline the mask or the object to be exposed relative to an optical axis of the projection optical system. A shape of the auxiliary pattern may be analogous to that of the desired pattern.

An exposure apparatus of another aspect of the present invention includes an illumination optical system for illuminating a mask that forms a desired pattern and an auxiliary pattern smaller than the desired pattern, and a projection optical system for projecting light from the mask onto an object to be exposed, wherein the exposure apparatus exposes the object at least at a defocus position offset from the best focus position.

The exposure apparatus may expose the object at the defocus position and at the best focus position. The exposure apparatus may further include a mechanism for inclining at least one of the mask and the object.

The exposure apparatus may further include a stage for supporting the object, and a drive mechanism for driving the object in an optical-axis direction of the projection optical system, wherein a distance A between the best focus position and the defocus position, which is driven by the drive mechanism meets the following equation $A \leq k_1 \times (D/S) \times (\lambda/NA^2)$, where D is a hole diameter of the contact-hole pattern, S is a hole diameter of the auxiliary pattern, P is a half-pitch of the contact-hole pattern and auxiliary pattern, $\lambda$ is a wavelength of exposure light, NA is a numerical aperture of the projection optical system, and $k_1=(NA/\lambda) \times P$.

A device fabricating method of still another aspect of the present invention includes the steps of exposing an object using the above exposure method or apparatus, and performing a predetermined process for the exposed object. Claims for a device fabricating method that performs operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

BRIEF DESCRIPTION OF THE DRAWINGS

FIG. 23 is a plane view that dissolves the effective light-source shape shown in FIG. 22 into two.

DETAILED DESCRIPTION OF THE PREFERRED EMBODIMENTS

Figure 8:
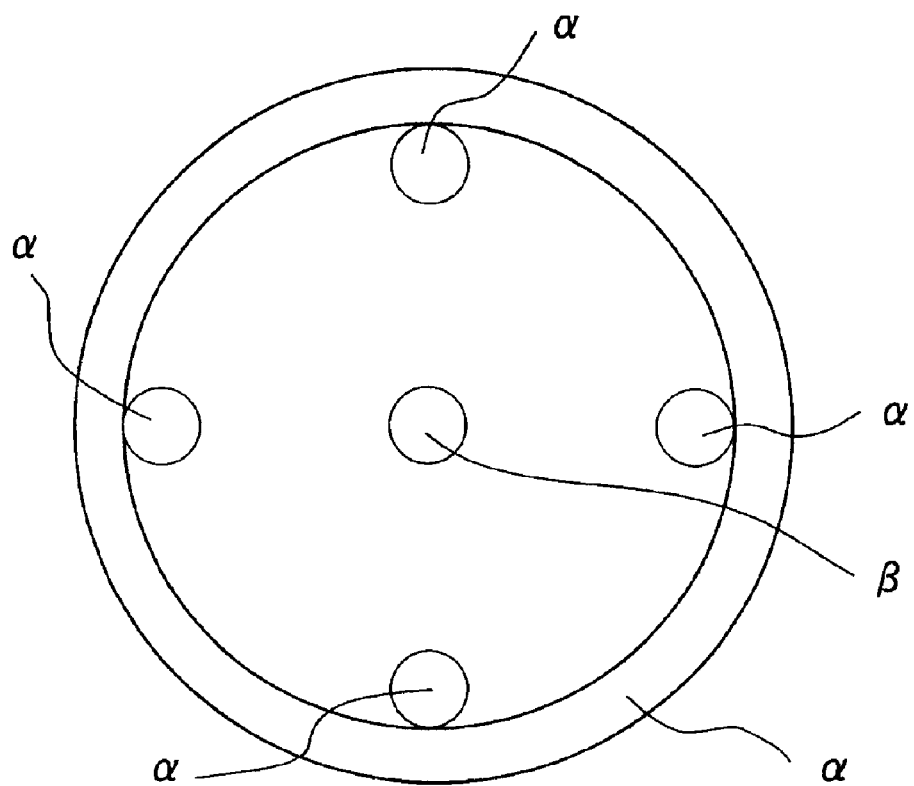
FIG. 8 is a schematic plane view of an exemplary effective light-source necessary to resolve only a contact-hole pattern on the reticle shown in FIG. 2.

The instant embodiment uses modified illumination to expose a reticle 200 that forms a contact-hole pattern 210 to be transferred and an auxiliary pattern 20 dimensioned below the resolving power limit. As illustrated, bevel part is light-shielding part made of Cr. An effective light source shown in FIG. 8 should be formed which includes modified illumination light a with high resolving power to resolve the contact-hole pattern 210 and illumination light β with low resolving power to restrain the auxiliary pattern 220 from resolving in order to transfer only the contact-hole patter 210 formed on the mask 200 onto an object to be exposed.

The auxiliary pattern 220 is smaller than the contact-hole pattern 210 in size and in permissible defocus range or DOF. Use of this fact and exposure at a position offset from the best focus position would restrain the auxiliary pattern 220 from resolving. The conventional illumination system using a prism forms an effective light-source distribution of strong modified illumination, and thus enhances the light use efficiency, improving the resolving power of the contact-hole pattern 210 without lowering the throughput. The "best focus position" is a focus position that provides the highest resolution.

A description will be given of the principle of the present invention with reference to FIG. 9. For description purposes, the reticle 200 and the object to be exposed have an actual-size imaging relationship.

Figure 9:
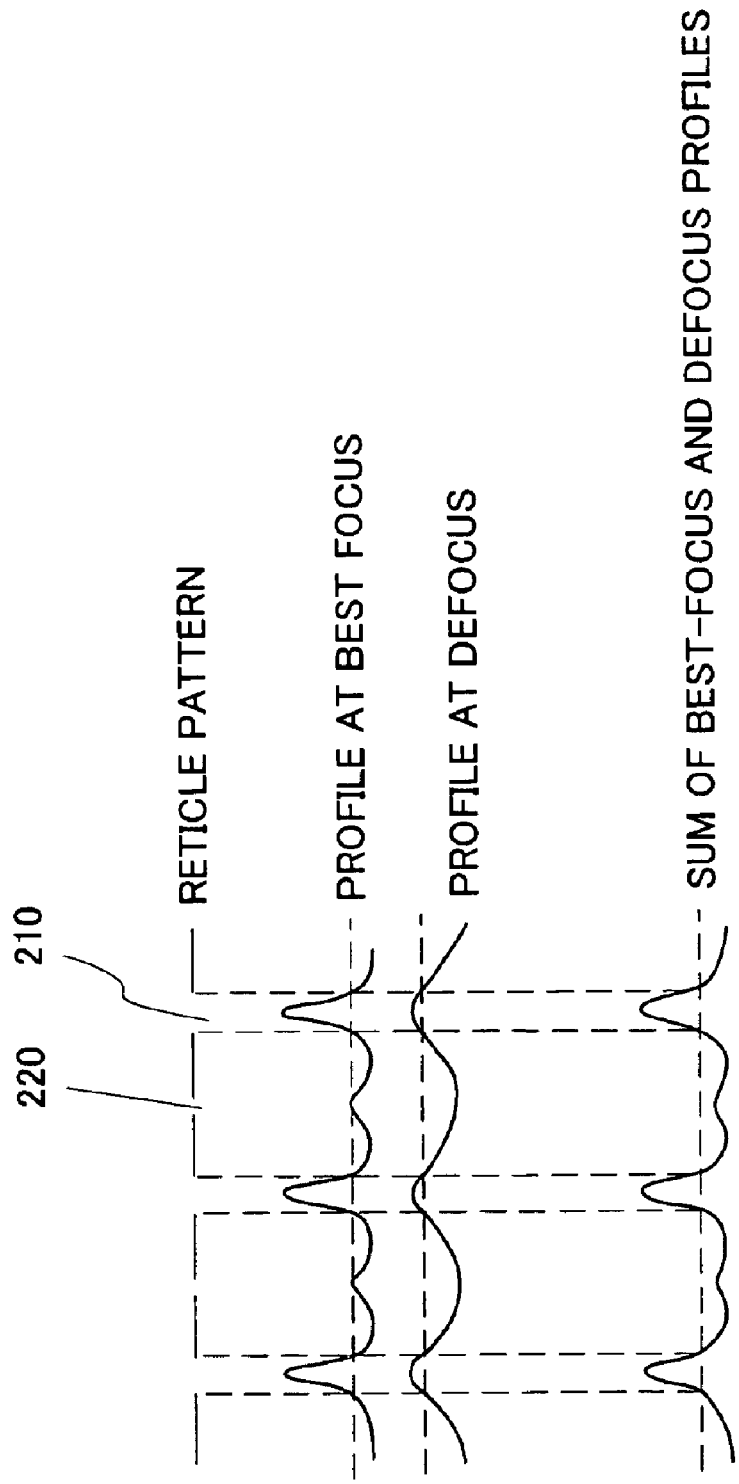
FIG. 9 is a view for explaining a principle of the present invention.

When the reticle 200 that includes the contact-hole pattern 210 and the auxiliary pattern 220 is exposed with strong modified illumination, the best focus position shows a corresponding profile as shown in FIG. 9. Since the exposure dose of the object to be exposed 400 is usually determined so as to correspond to a size of the contact-hole pattern 210 on the reticle 200, the exposure with the best focus has a slice level at a position indicated by one dotted line on a profile. Therefore, the exposure with the best focus resolves the auxiliary pattern and would create a transfer pattern different from a shape of the desired contact-hole pattern 210.

On the other hand, exposure with defocus indicates a corresponding profile as show in FIG. 9. As discussed, since the fine auxiliary pattern 220 has a small DOF and does not have a contrast, its profile has a gentle peak at the contact-hole pattern 210. Only the contact-hole pattern 210 resolves, when the reticle 200 that includes the contact-hole pattern 210 and the auxiliary pattern 220 is illuminated with strong modified illumination and exposed at a defocus position. This is the principle of the present invention.

Exposure with fluctuating exposure dose at a defocus position may change a critical dimension due to low contrast of an image. Therefore, the small tolerance of a fluctuation of the exposure dose lowers the yield of a patterned chip.

More preferably, exposures repeat at the best focus position and a defocus position. With the exposures at the best focus position and at the defocus position, a sum of the best-focus profile and the defocus profile restrains the auxiliary pattern 220 from resolving, and enhances the contrast of an image larger than that of the exposure at the defocus position, expanding the tolerance to a fluctuation of the exposure dose and improving the yield of the chip.

A description will now be given of the exposure method of one embodiment according to the present invention with reference to accompanying drawings. The present invention is not limited to these embodiments and each element is replaceable within a scope that achieves the objects of the present invention. The same element in each figure is designated by the same reference numeral, and a description will be omitted.

Figure 1:
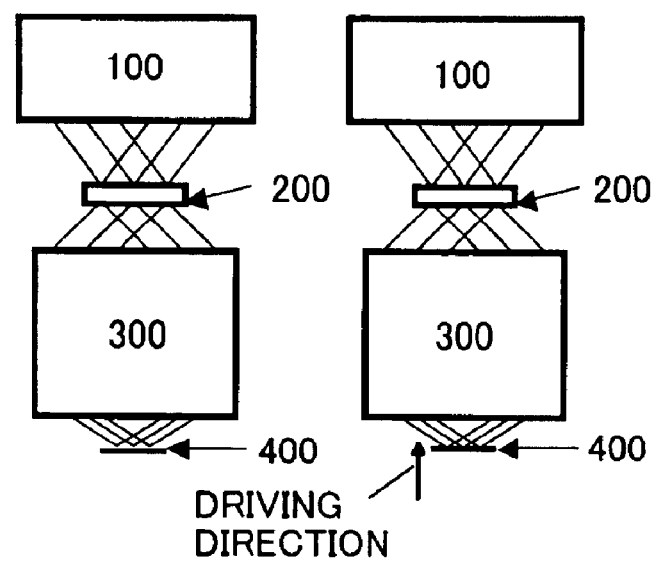
FIG. 1 is a schematic view of a first embodiment according to the present invention.

FIG. 1 shows a first embodiment according to the present invention. The instant embodiment uses double exposure at the best-focus position and at a defocus position other than the best-focus position. Referring to FIG. 1, the illumination optical system 100 illuminates a target surface with uniform light intensity with the off-axis illumination with improved resolving power to resolve the fine pattern.

Figure 3:
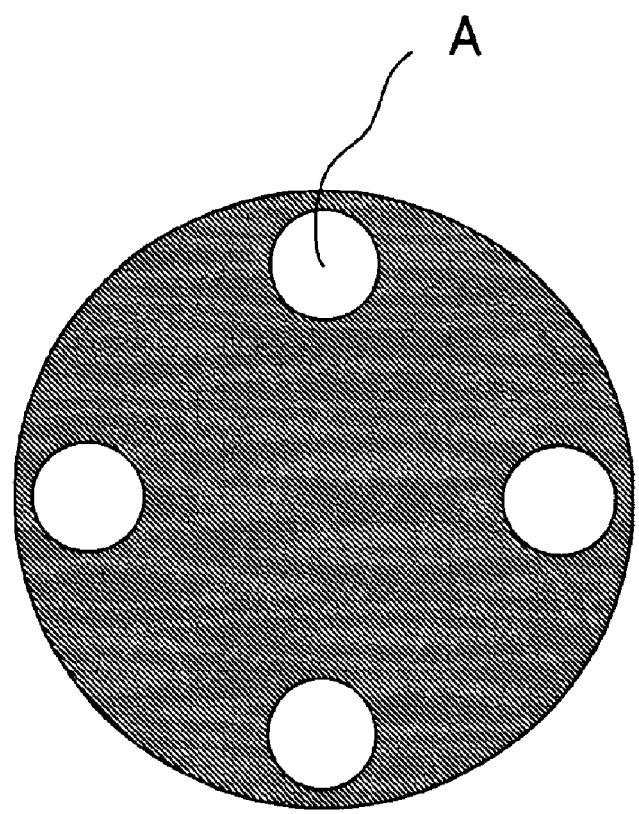
FIG. 3 is a schematic plane view showing an exemplary effective light-source distribution.
Figure 4:
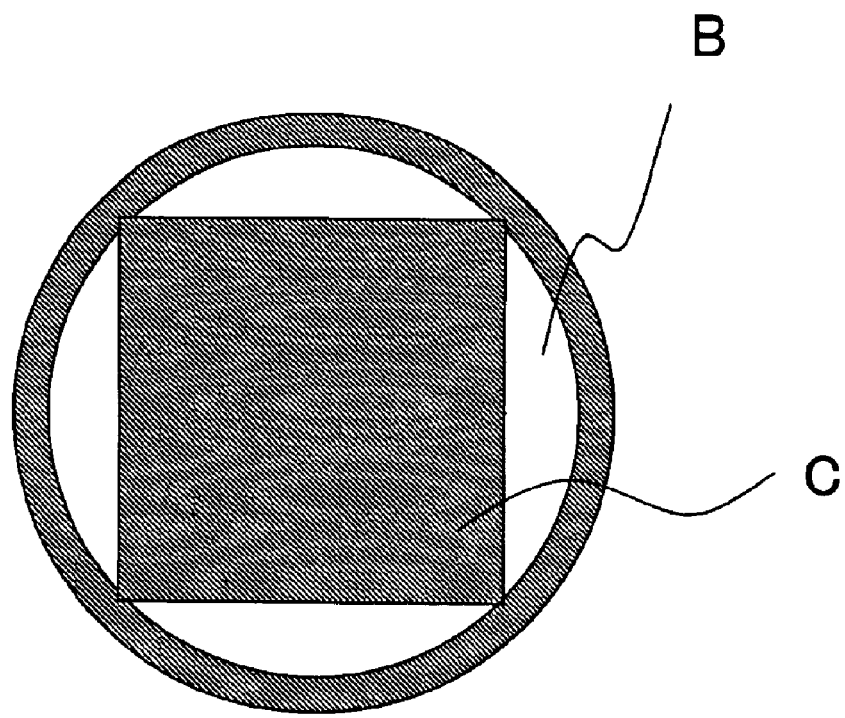
FIG. 4 is a schematic plane view showing an exemplary effective light-source distribution.
Figure 5:
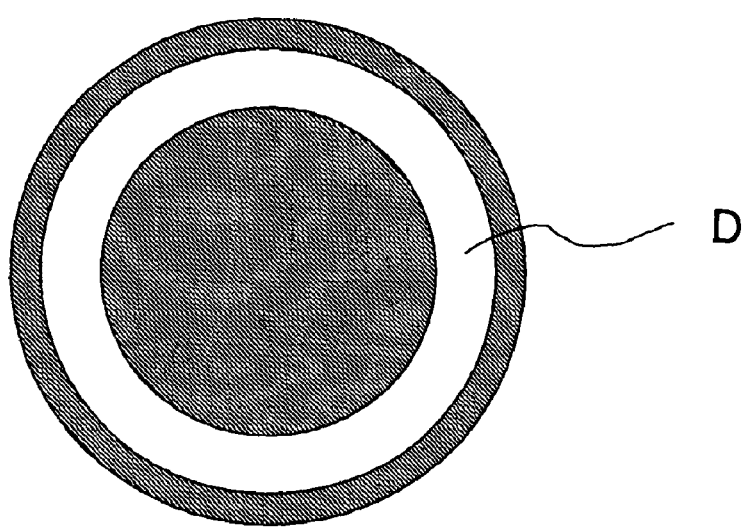
FIG. 5 is a schematic plane view showing an exemplary effective light-source distribution.

An exemplary pupil intensity distribution of the illumination optical system 100 that uses the off-axis illumination to improve the resolving power includes a quadrupole distribution with four circular apertures A at biased positions as shown in FIG. 3, a quadrupole distribution with a circular aperture B and rectangular light-shielding part C as shown in FIG. 4, and an annular distribution with an annular aperture D as shown in FIG. 5.

It is desirable to use a conventional prism to form an effective light-source distribution for the modified illumination. When the effective light-source distribution cannot be formed only with a prism, the stop may be used to shield light. The present invention may use any method to form the effective light-source distribution. The bevel part is dark part in FIGS. 3 to 5.

Figure 2:
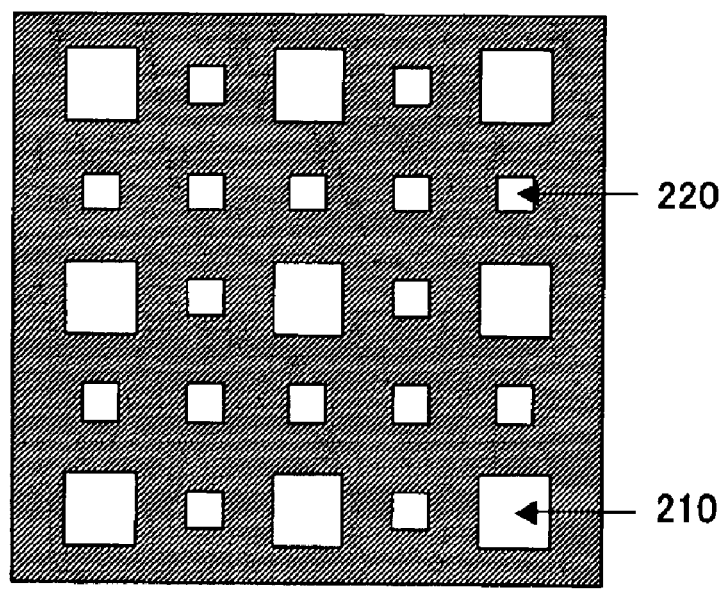
FIG. 2 is a schematic view of a reticle that forms a contact-hole pattern and an auxiliary pattern.

The projection optical system 300 projects a pattern formed on the reticle 200 shown in FIG. 2 onto the plate 400 onto which photosensitive material referred to as resist has been applied.

The first embodiment provides first exposure at the best focus position, and then second exposure at a defocus position by moving the resist-applied plate 400 in the optical-axis direction. An offset range or defocus amount "A" of the plate 400 from the best focus position preferably meets the following equation:

$$0 < A \leq k_1 \times (D/S) \times (\lambda/NA^2) \quad (3)$$

where D is a hole diameter of the contact-hole pattern 210, S is a hole diameter of the auxiliary pattern 220, P is a half-pitch of the contact-hole pattern 210 and auxiliary pattern 220, λ is a wavelength of exposure light, NA is a numerical aperture of the projection optical system 400, and $k_1 = (NA/\lambda) \times P$.

The first and second exposures may continue for each shot, or the second exposures for all the shots may follow after the first exposures for all the shots. Alternatively, the first exposure may use a defocus position offset from the best focus position while the second exposure may use the best focus position. The exposure may use only the defocus position although the permissible amount to the fluctuating exposure dose becomes small.

Figure 6:
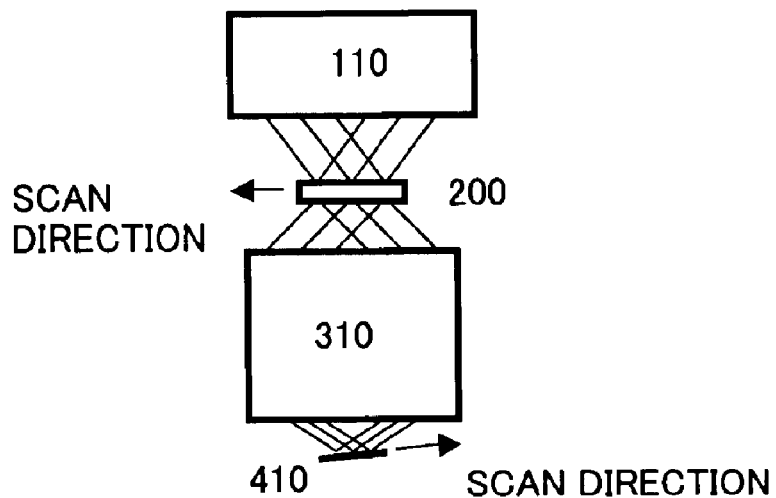
FIG. 6 is a schematic view of a second embodiment according to the present invention.

FIG. 6 shows a second embodiment, which uses a scanning projection exposure apparatus that synchronously scans the reticle 200 that forms a pattern and the plate 410 with resist, and projects the part of the pattern onto the plate 410 for each shot.

The illumination optical system 110 illuminates a target surface with uniform light intensity using the off-axis illumination with improved resolving power to resolve a fine pattern.

The projection optical system 310 projects part of the pattern formed on the reticle 200 shown in FIG. 2 onto the plat 410 onto which the photosensitive material called resist has been applied. A synchronous scan between the reticle 200 and the plate 410 while projecting the part of the pattern onto the plate 410 may transfer the entire surface of the reticle 200 onto the plate 410. The second embodiment scans and exposes the inclined plate 410 at the best focus position and at a defocus position. Even in this embodiment, a moving distance between the best focus position and the defocus position meets Equation (3). The plate 410 is inclined relative to the optical axis of the projection optical system 310, and exposed at the best focus position and at the defocus position, in transferring the reticle pattern onto the plate 410 with the resist.

Figure 7:
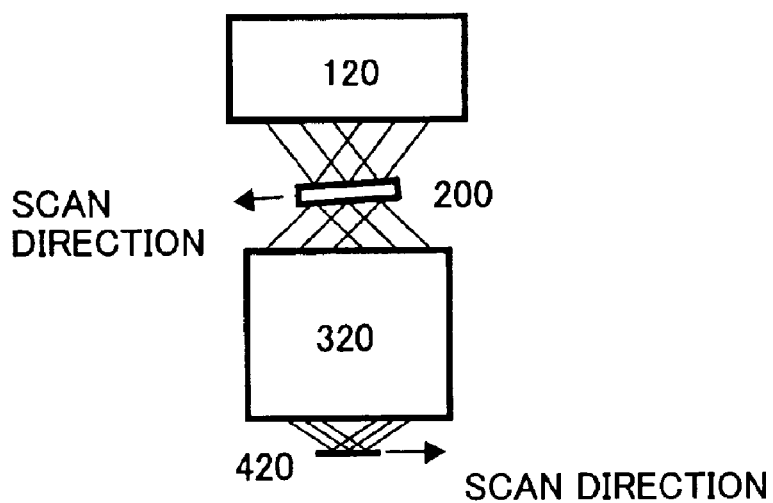
FIG. 7 is a schematic view of a third embodiment according to the present invention.

FIG. 7 shows a third embodiment, which uses a scanning projection exposure apparatus that synchronously scans the reticle 200 that forms a pattern and the plate 420 with resist, and projects the part of the pattern onto the plate 420 for each shot.

The illumination optical system 120 illuminates a target surface with uniform light intensity using the off-axis illumination with improved resolving power to resolve a fine pattern.

The projection optical system 320 projects part of the pattern formed on the reticle 200 shown in FIG. 2 onto the plat 420 onto which the photosensitive material called resist has been applied. A synchronous scan between the reticle 200 and the plate 420 while projecting the part of the pattern onto the plate 420 may transfer the entire surface of the reticle 200 onto the plate 420. The third embodiment scans and exposes the inclined reticle 200 at the best focus position and at a defocus position. Even in this embodiment, a moving distance between the best focus position and the defocus position meets Equation (3). Since the reticle 200 inclines to the optical axis of the projection optical system 320, the best focus position inclines to the optical axis of the projection optical system 320. The reticle 200 is inclined relative to the optical axis of the projection optical system 320, and exposed at the best focus position and the defocus position, in transferring the reticle pattern onto the plate 410 with the resist.

In exposing the reticle pattern onto the photosensitive plate at best focus position and the defocus position, a fourth embodiment intentionally generates a curvature of field in the projection optical system in a scanning projection exposure apparatus, and scans and exposes the reticle and photosensitive plate perpendicular to the optical axis of the projection optical system. The projection optical system includes plural lens and/or lens group that are designed to automatically adjust its driving in the optical-axis direction. A movement of a specific lens group in the optical-axis direction may generate a curvature of field in the projection optical system. In the inventive exposure, the fourth embodiment according to the present invention automatically adjust driving the projection optical system, generates a certain curvature of field so as to create a predetermined defocus amount, and scans and exposes the reticle and photosensitive plate perpendicular to the projection optical system.

While the above embodiments use an approximately square for the opening shape in the mask pattern, the opening shape is not limited to a square but may use rectangular, cross and T shapes.

When the desired pattern has a rectangular shape, the auxiliary pattern also has a similar shape to improve resolution of the desired pattern.

Figure 10:
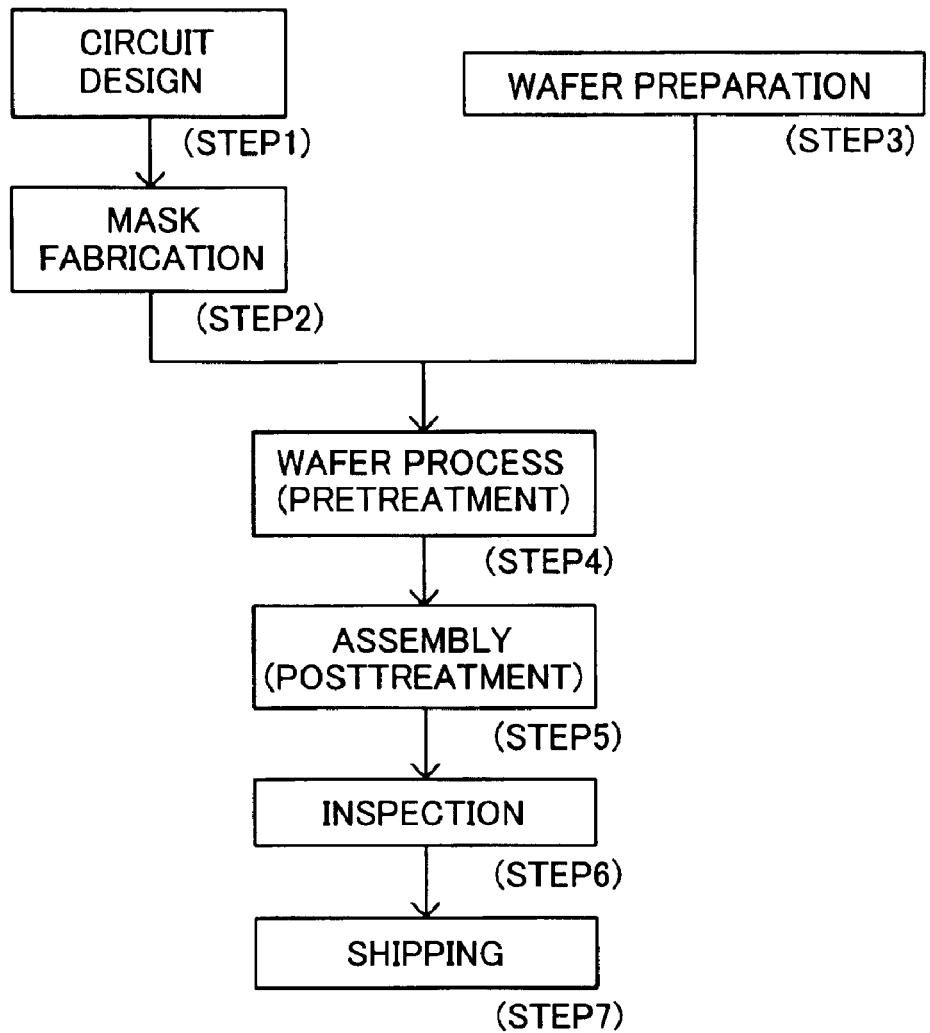
FIG. 10 is a flowchart for explaining how to fabricate devices (such as semiconductor chips such as ICs and LCDs, CCDs, and the like).
Figure 11:
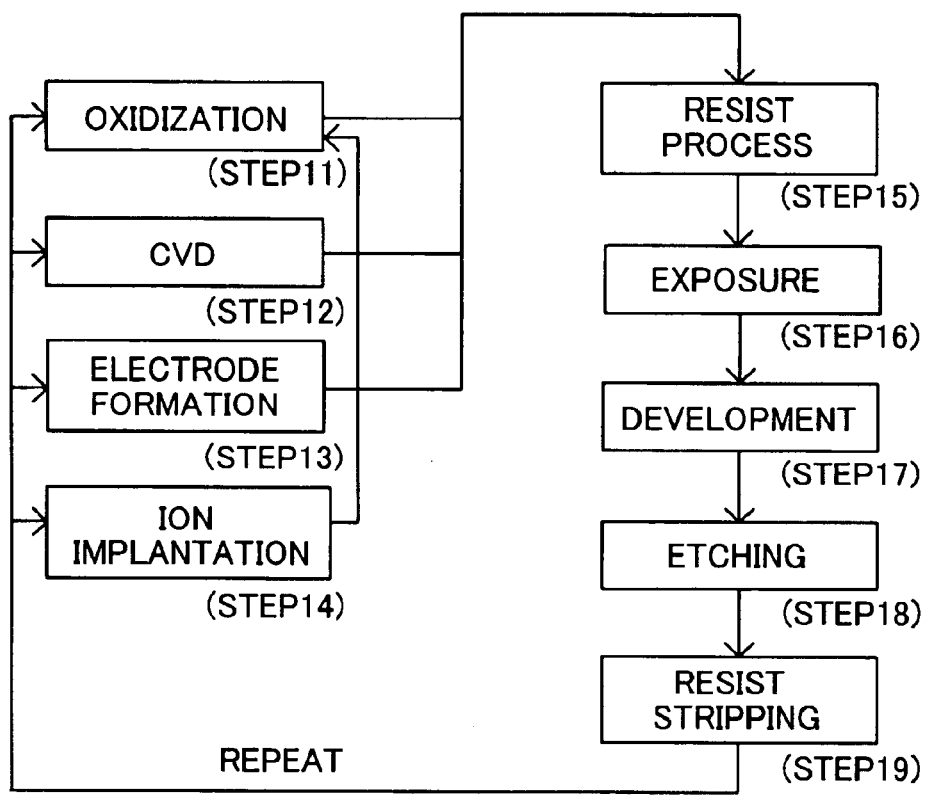
FIG. 11 is a detail flowchart of a wafer process as Step 4 shown in FIG. 10.
Figure 12:
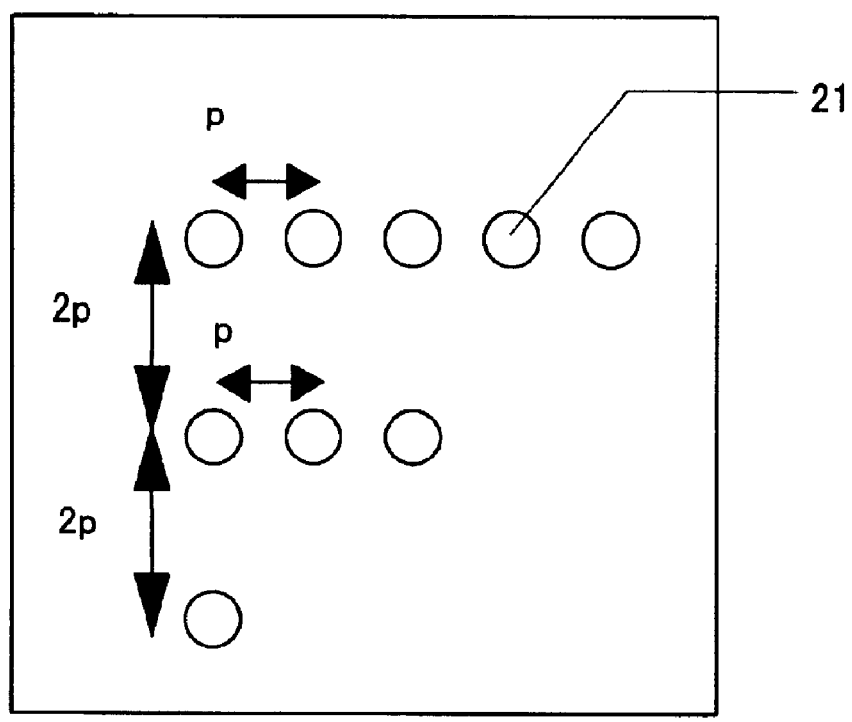
FIG. 12 is a plane view of a contact-hole pattern.
Figure 13:
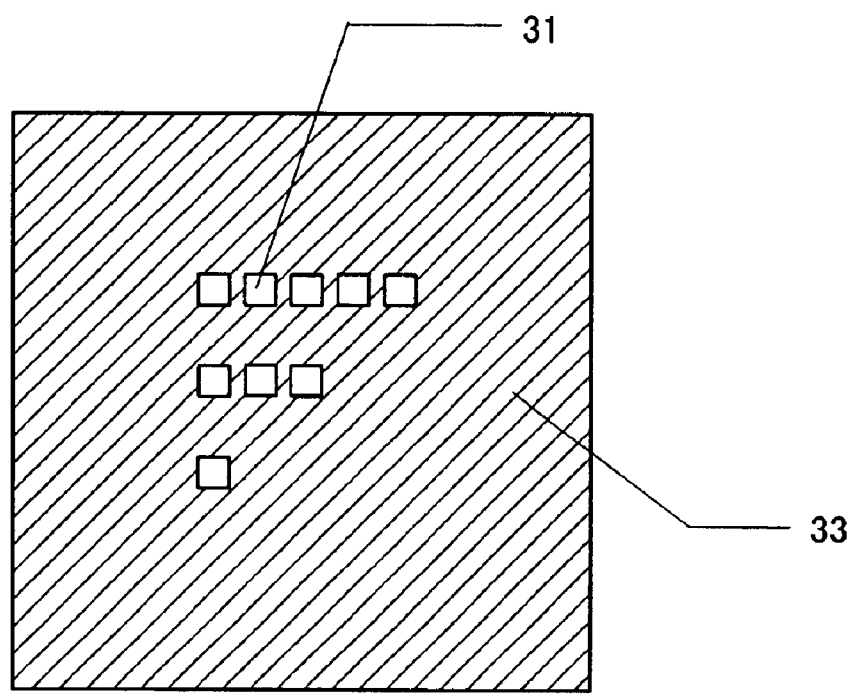
FIG. 13 is a schematic plane view of a mask pattern that arranges only a desired pattern to form a contact-hole pattern.
Figure 14:
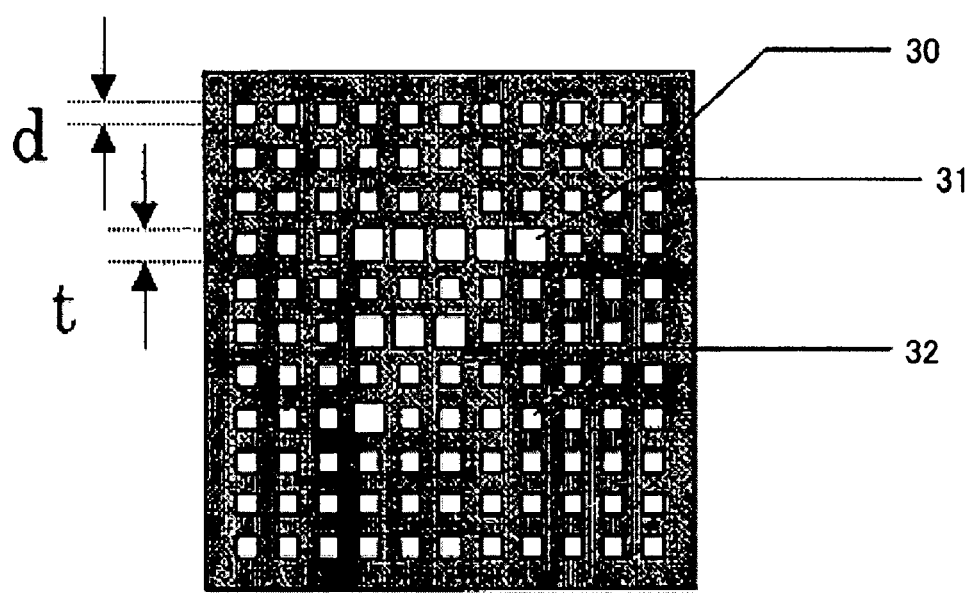
FIG. 14 is a schematic plane view of a mask pattern that arranges a desired pattern and an auxiliary pattern to form a contact-hole pattern.
Figure 15A:
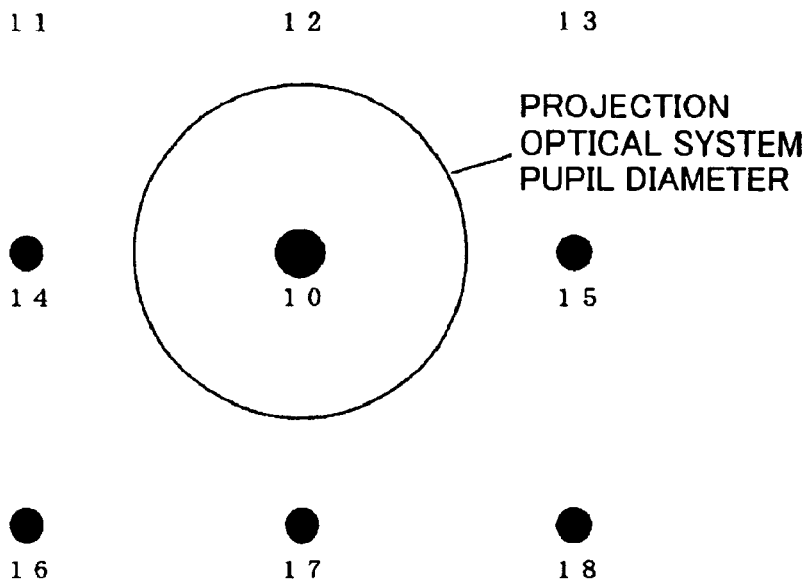
FIG. 15 is schematic views showing positions of diffracted beams on a pupil surface for small σ illumination and oblique incidence illumination to the binary mask shown in FIG. 14.
Figure 15B:
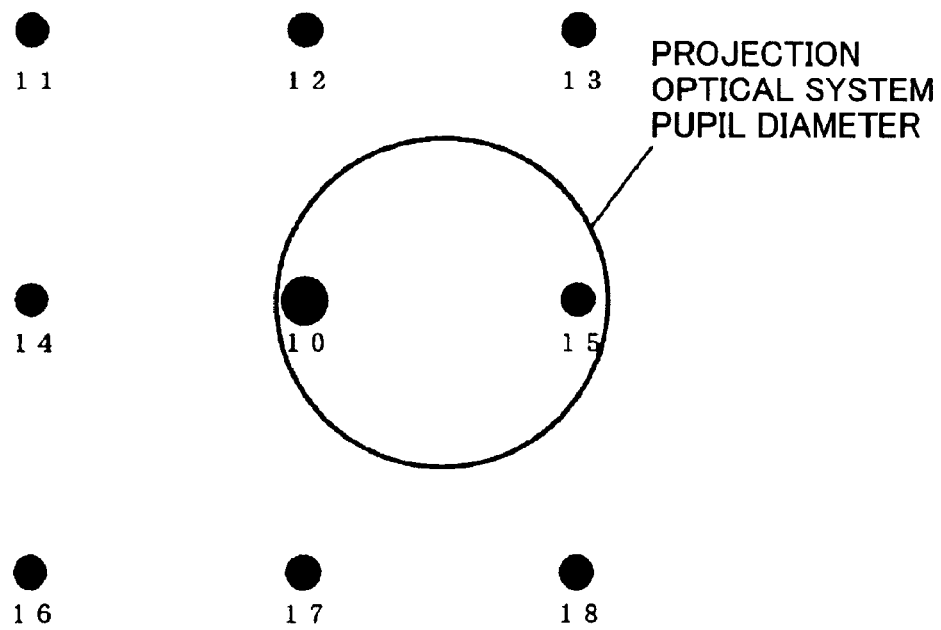
Figure 16:
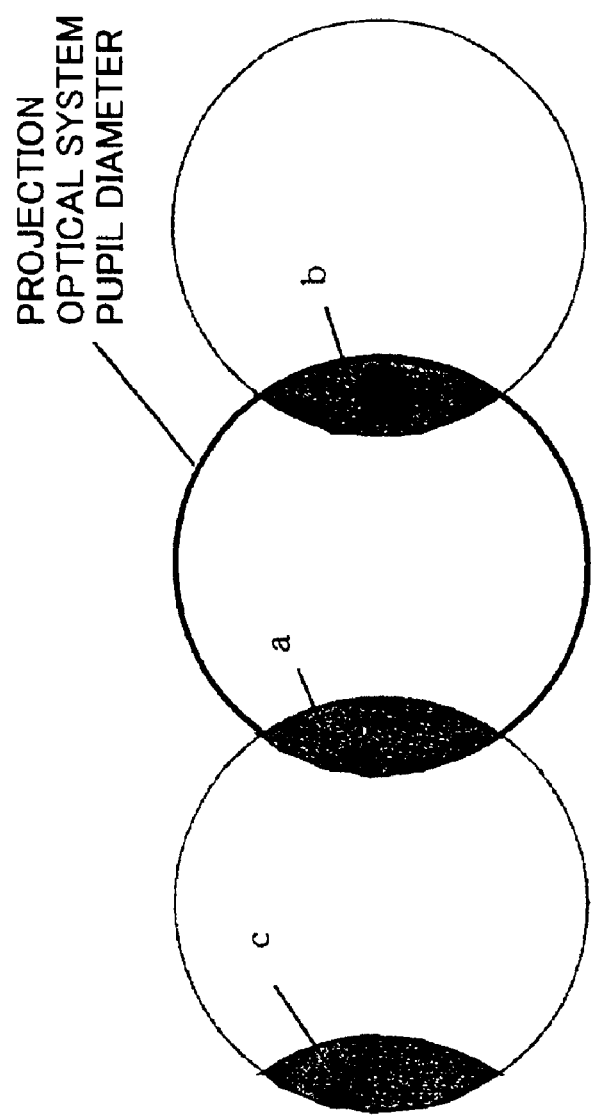
FIG. 16 is a view showing a relationship between $0^{th}$ order and $1^{st}$ order beams for oblique incidence illumination to a certain fine-pitch pattern.
Figure 17:
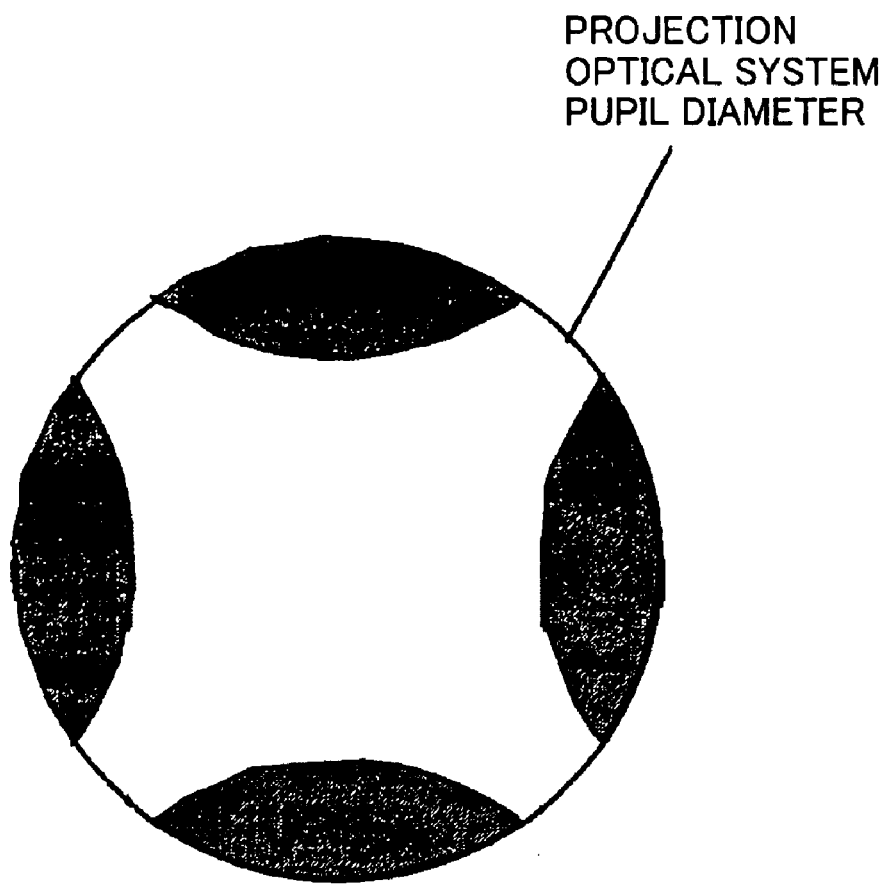
FIG. 17 is a view that combines four streamlined effective light-source areas (or $0^{th}$ order beam areas) as partial overlap of two circles.
Figure 18:
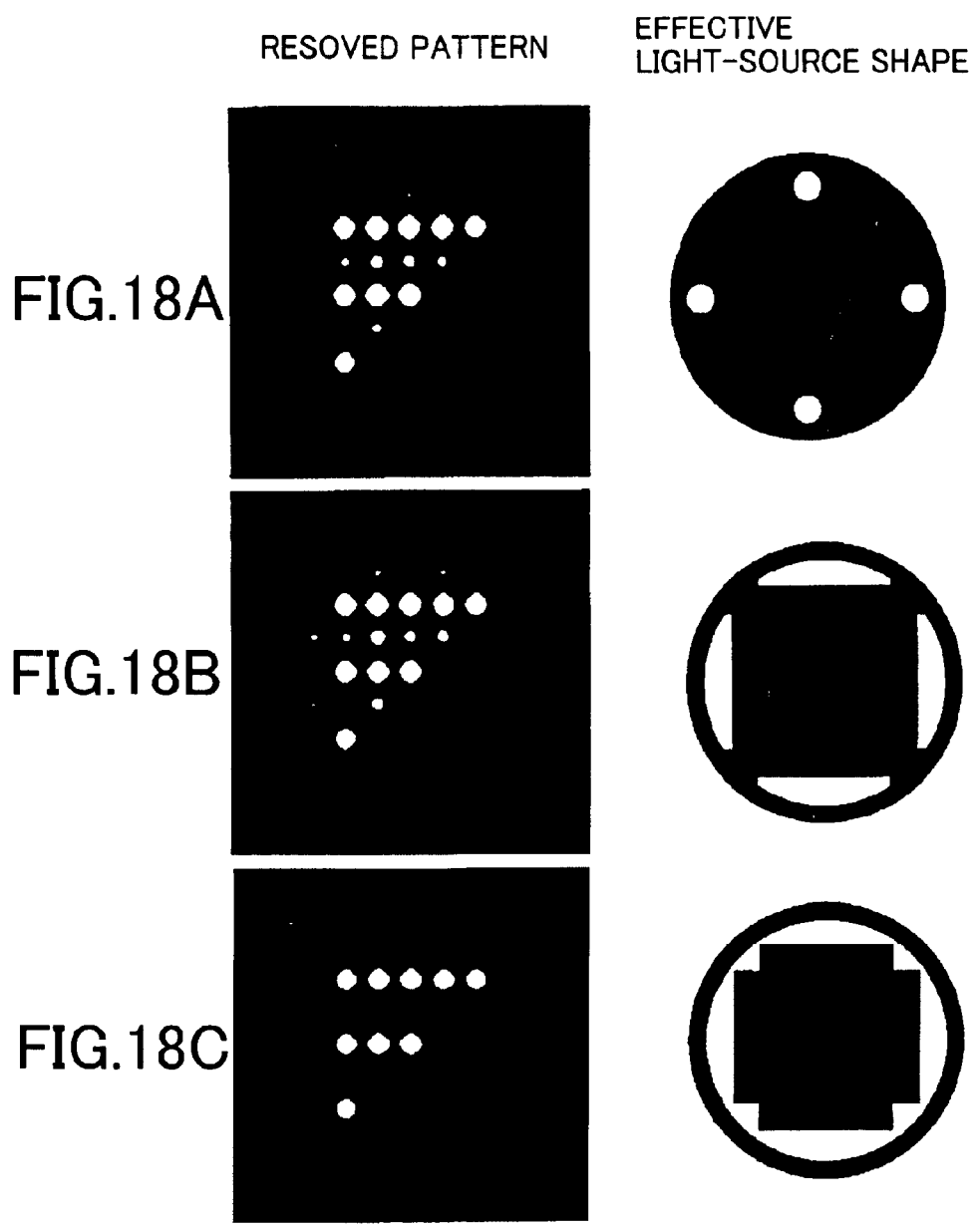
FIG. 18 is a view of simulated resolution pattern on an object to be exposed.
Figure 19:
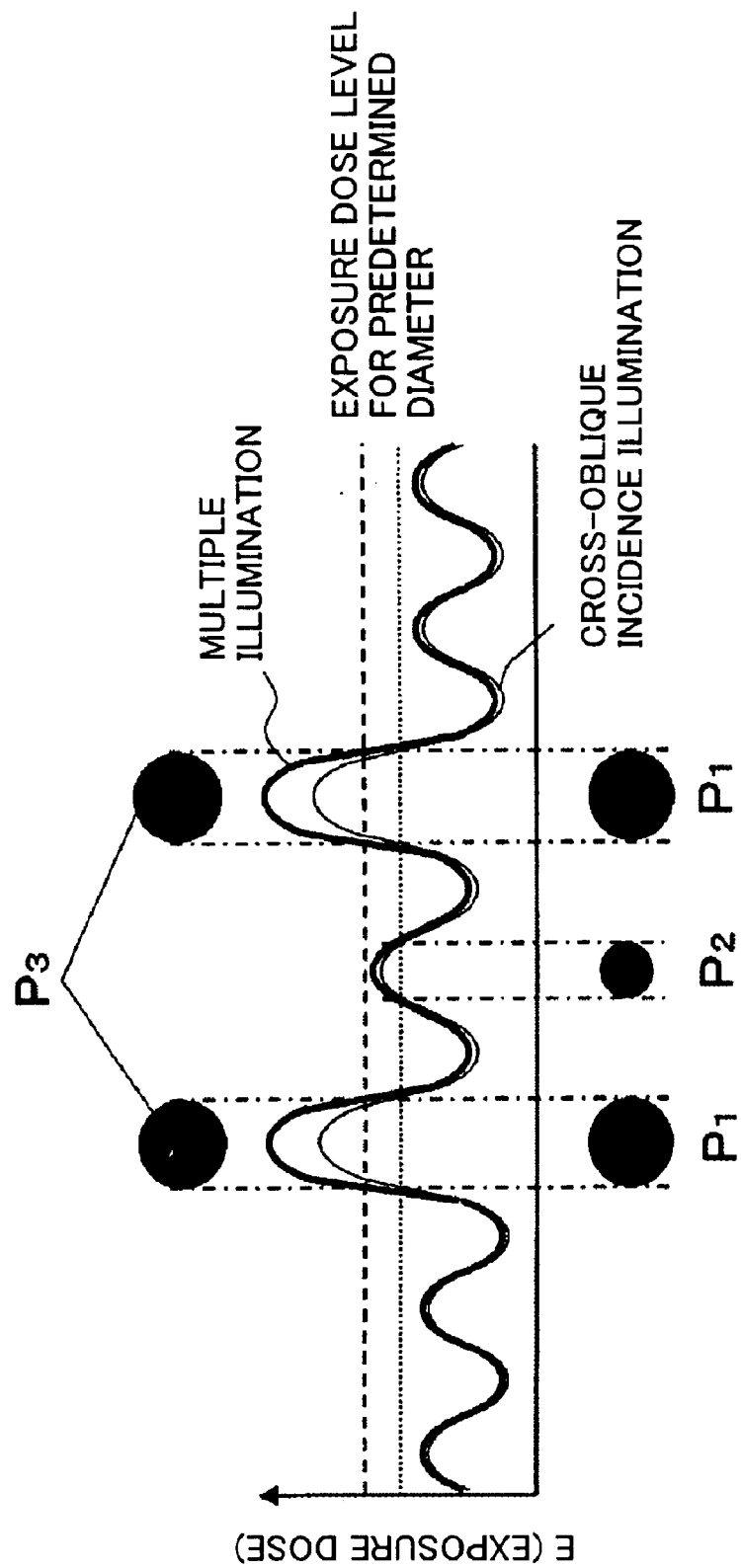
FIG. 19 is a view showing exposure dose in modified illumination and an image on the object to be exposed corresponding to the exposure dose.
Figure 20:
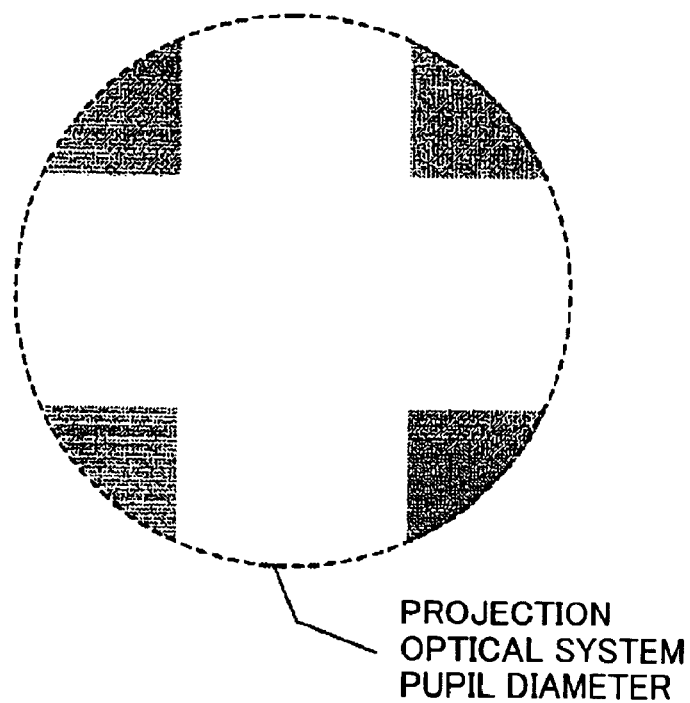
FIG. 20 is a schematic view for explaining an effective light-source distribution.
Figure 21:
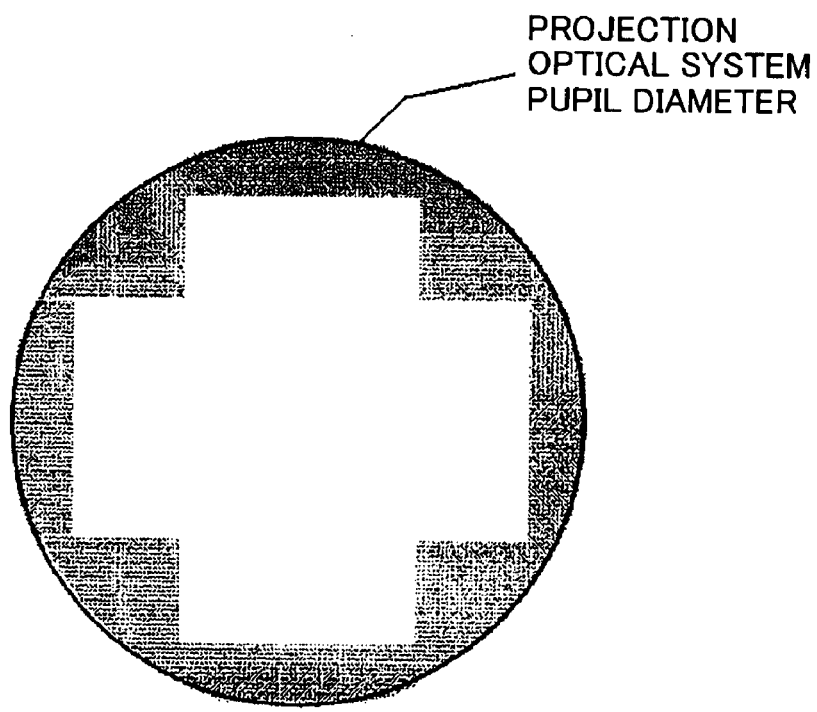
FIG. 21 is a schematic view for explaining an effective light-source distribution.
Figure 22:
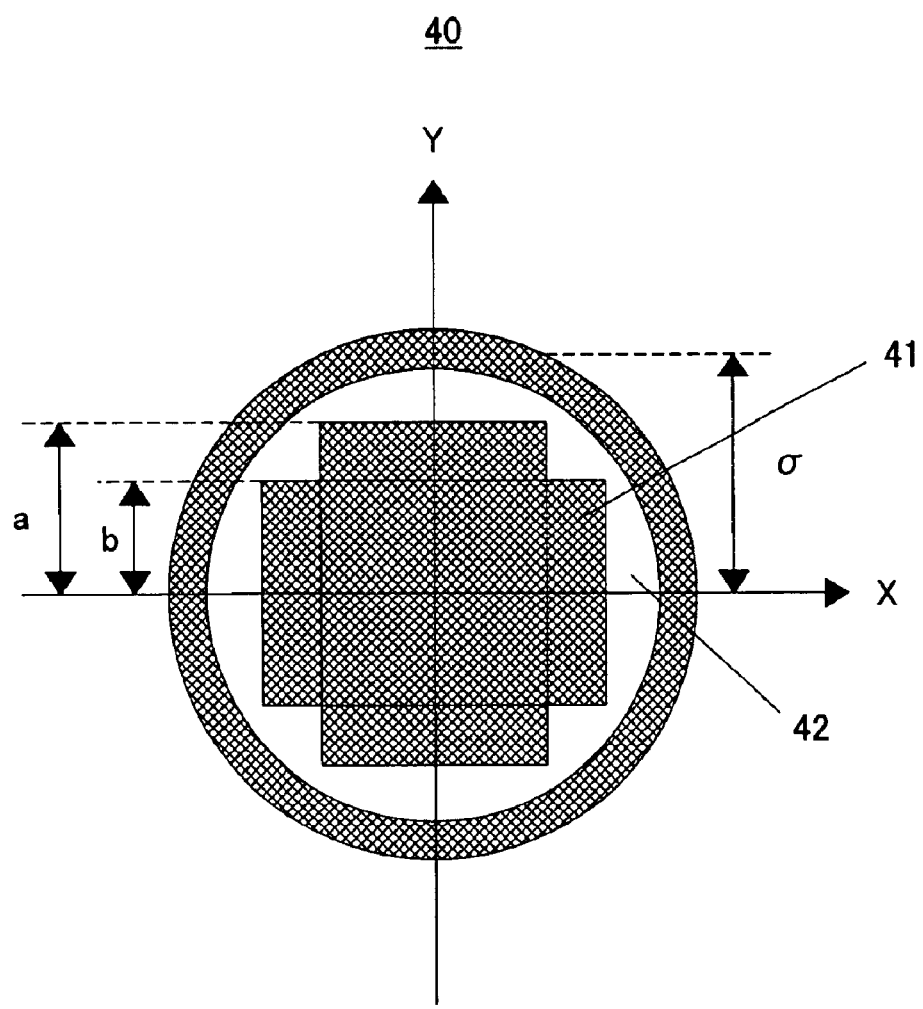
FIG. 22 is a schematic view showing an example of effective light-source shape to resolve the mask pattern shown in FIG. 14.
Figure 23B:
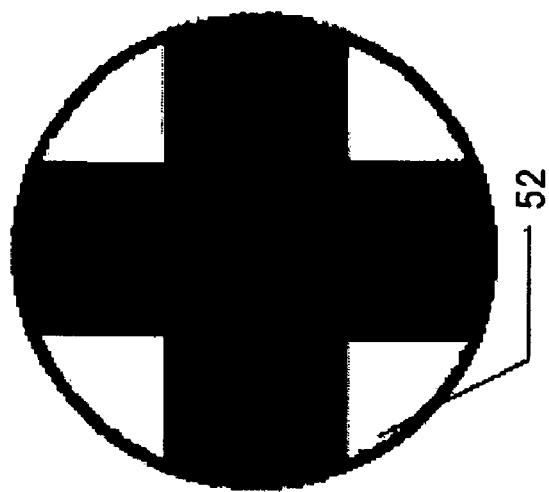
FIG. 23B is a schematic plane view of the part that restrains the auxiliary pattern from resolving.
Figure 23A:
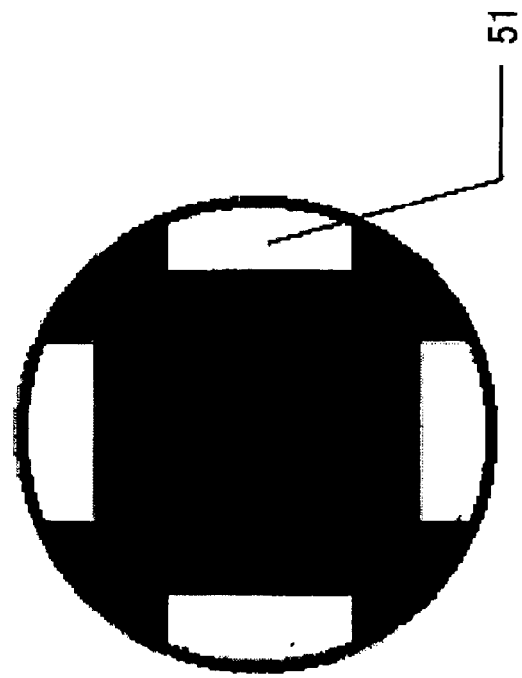
FIG. 23A is a schematic plane view of the part that contribute to resolution of the desired pattern.

Referring now to FIGS. 10 and 11, a description will be given of an embodiment of a device fabricating method using the above exposure method. FIG. 10 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Further, the present invention is not limited to these preferred embodiments, and various variations and modifications may be made without departing from the scope of the present invention.

The present invention thus may provide an exposure method that improves the resolving power for a desired pattern to be transferred without lowering the light use efficiency and throughput.

What is claimed is:

1. An exposure method comprising the steps of:
   illuminating a mask that forms a contact-hole pattern and auxiliary pattern smaller than the contact-hole pattern with light from a light source: and
   projecting light from the mask onto an object to be exposed via a projection optical system at least at a position having a distance from a focus position at provides the highest resolution,
   wherein the distance A meets the following equation:

$$0 < A \leq k_1 \times (D/S) \times (\lambda/NA_2)$$

where D is a hole diameter of the contact-hole pattern, S is a hole diameter of the auxiliary pattern, P is a half-pitch of the contact-hole pattern and auxiliary pattern, $\lambda$ is a wavelength of the light from the light source, NA is a numerical aperture of the projection optical system, and $k1 = (NA/\lambda) \times P$.

2. An exposure method according to claim 1, wherein the mask two-dimensionally arranges the contact-hole pattern and the auxiliary pattern like a matrix.

3. An exposure method according to claim 1, wherein said illuminating step forms a quadrupole effective light-source shape that includes two pairs of light transmitting parts, two lines each connecting each pair of light transmitting parts constituting a coordinate for the contact-hole pattern.

4. An exposure method according to claim 1, wherein said illuminating step uses illumination light that includes a first component incident perpendicularly upon the mask, and a second component that is incident obliquely upon the mask and has light amount smaller than that of the first component.

5. An exposure method according to claim 1, wherein said projection step inclines the mask or the object to be exposed relative to an optical axis of the projection optical system.

6. An exposure method according to claim 1, wherein a shape of the auxiliary pattern is analogous to that of the desired pattern.

7. An exposure apparatus comprising:

an illumination optical system for illuminating a mask that forms a a contact-hole pattern and an auxiliary pattern smaller than the contact-hole pattern with light from a light source; and a projection optical system for projecting light from the mask onto object to be exposed, wherein said exposure apparatus exposes the object at least at a defocus position having a distance from a focus position that provides the highest resolution, and wherein the distance A meets the following equation:

$$0 < A \leq k_1 \times (D/S) \times (\lambda/NA^2)$$

where D is a hole diameter of the contact-hole pattern, S is a hole diameter of the auxiliary pattern, P is a half-pitch of the contact-hole pattern and auxiliary pattern, $\lambda$ is a wavelength of the light from the light source, NA is a numerical aperture of the projection optical system, and k1=(NA/$\lambda$)×P.

8. An exposure apparatus according to claim 7, wherein said exposure apparatus exposes the object at the defocus position and at the focus position.

9. An exposure apparatus according to claim 7, further comprising a mechanism for inclining at least one of the mask and the object.

10. A device fabricating method comprising the steps of:

exposing an object using an exposure apparatus; and performing a predetermined process for the object that has been exposed, wherein the exposure apparatus includes:

an illumination optical system for illuminating a mask that forms a contact-hole pattern and an auxiliary pattern smaller than the contact-hole pattern with light from a light source; and a projection optical system for projecting light from the mask onto object to be exposed, wherein said exposure apparatus exposes the object at least at a defocus position having a distance from a focus position that provides the highest resolution, and wherein the distance A meets the following equation:

$$0 < A \leq K_1 \times (D/S) \times (\lambda/NA^2)$$

where D is a hole diameter of the contact-hole pattern, S is a hole diameter of the auxiliary pattern, P is a half-pitch of the contact-hole pattern and auxiliary pattern, $\lambda$ is a wavelength of the light from the light source, NA is a numerical aperture of the projection optical system, and k1=(NA/$\lambda$)×P.

* * * * *